(12) United States Patent
Fujita

(10) Patent No.: US 9,012,959 B2
(45) Date of Patent: Apr. 21, 2015

(54) SEMICONDUCTOR DEVICE

(71) Applicant: Mitsubishi Electric Corporation, Tokyo (JP)

(72) Inventor: Koichi Fujita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/198,763

(22) Filed: Mar. 6, 2014

(65) Prior Publication Data

US 2014/0353724 A1    Dec. 4, 2014

(30) Foreign Application Priority Data

Jun. 4, 2013   (JP) ................. 2013-118017

(51) Int. Cl.
*H01L 29/66* (2006.01)
*H01L 29/778* (2006.01)
*H01L 21/02* (2006.01)
*H01L 21/22* (2006.01)

(52) U.S. Cl.
CPC ........ *H01L 29/778* (2013.01); *H01L 21/02518* (2013.01); *H01L 21/22* (2013.01)

(58) Field of Classification Search
CPC ................. H01L 29/778; H01L 21/02518
USPC .......................... 257/195, 409, 487
See application file for complete search history.

(56) References Cited

U.S. PATENT DOCUMENTS 7,915,645 B2    3/2011  Briere
2014/0353724 A1*  12/2014  Fujita ........................ 257/195

FOREIGN PATENT DOCUMENTS

JP       2010-40814 A    2/2010
WO    WO 2013/065243 A1    5/2013

* cited by examiner

*Primary Examiner* — Mark Prenty
(74) *Attorney, Agent, or Firm* — Leydig, Voit & Mayer, Ltd.

(57) ABSTRACT

A semiconductor device includes: a semiconductor substrate having an upper surface and a lower surface; a field effect transistor having a semiconductor layer on the upper surface of the semiconductor substrate, a gate electrode, a drain electrode, and a source electrode; a P-type diffusion region in the semiconductor substrate and extending to the upper surface of the semiconductor substrate; a first N-type diffusion region in the semiconductor substrate and extending t the upper surface of the semiconductor substrate; a first connection electrode connecting the P-type diffusion region to a grounding point; and a second connection electrode connecting the first N-type diffusion region to the gate electrode or the drain electrode. The P-type diffusion region and the first N-type diffusion region constitute a bidirectional lateral diode.

6 Claims, 12 Drawing Sheets

US 9,012,959 B2

SEMICONDUCTOR DEVICE

BACKGROUND OF THE INVENTION

1. Field of the Invention

The present invention relates to a semiconductor device that protects a gallium nitride high electron mobility field effect transistor (abbreviated as GaN-HEMT, hereinafter) from surge breakdown and to a method of manufacturing the semiconductor device.

2. Background Art

When a surge current of several amperes flows into a GaN-HEMT from the outside via a gate pad, part or the whole of the GaN-based epitaxial layer right below the gate electrode breaks or degrades and the GaN-HEMT breaks or degrades. A semiconductor device in which a vertical PN diode is connected to a GaN-HEMT to bypass a surge current has therefore been proposed (see, for example, Japanese Patent Laid-Open No. 2010-040814.

SUMMARY OF THE INVENTION

The conventional device uses a P-type Si substrate as the anode of the vertical PN diode. However, it is difficult to control the impurity concentration in the P-type Si substrate and it is, therefore, difficult to control the breakdown voltage of the diode.

In the vertical PN diode in the conventional device, the distance between the gate electrode and GND is large and, therefore, the series resistance of the diode after breakdown is large. There is, therefore, a problem that the diode can be thermally broken by a surge current.

The present invention has been achieved to solve the above-described problem and an object of the present invention is to provide a semiconductor device capable of preventing breakdown or degradation under a surge and controlling the breakdown voltage and a method of manufacturing the semiconductor device.

According to the present invention, a semiconductor device includes: a semiconductor substrate having an upper surface and a lower surface; a field effect transistor having a semiconductor layer on the upper surface of the semiconductor substrate, a gate electrode, a drain electrode, and a source electrode; a P-type diffusion layer on the upper surface of the semiconductor substrate; a first N-type diffusion layer on the upper surface of the semiconductor substrate; a first connection electrode connecting the P-type diffusion layer to a grounding point; and a second connection electrode connecting the first N-type diffusion layer to the gate electrode or the drain electrode, wherein the P-type diffusion layer and the first N-type diffusion layer constitute a bidirectional lateral diode.

The present invention makes it possible to prevent breakdown or degradation under a surge and control the breakdown voltage.

Other and further objects, features and advantages of the invention will appear more fully from the following description.

DETAILED DESCRIPTION OF THE PREFERRED EMBODIMENTS

A semiconductor device and a method of manufacturing the semiconductor device according to the embodiments of the present invention will be described with reference to the drawings. The same components will be denoted by the same symbols, and the repeated description thereof may be omitted.

First Embodiment

Figure 1:
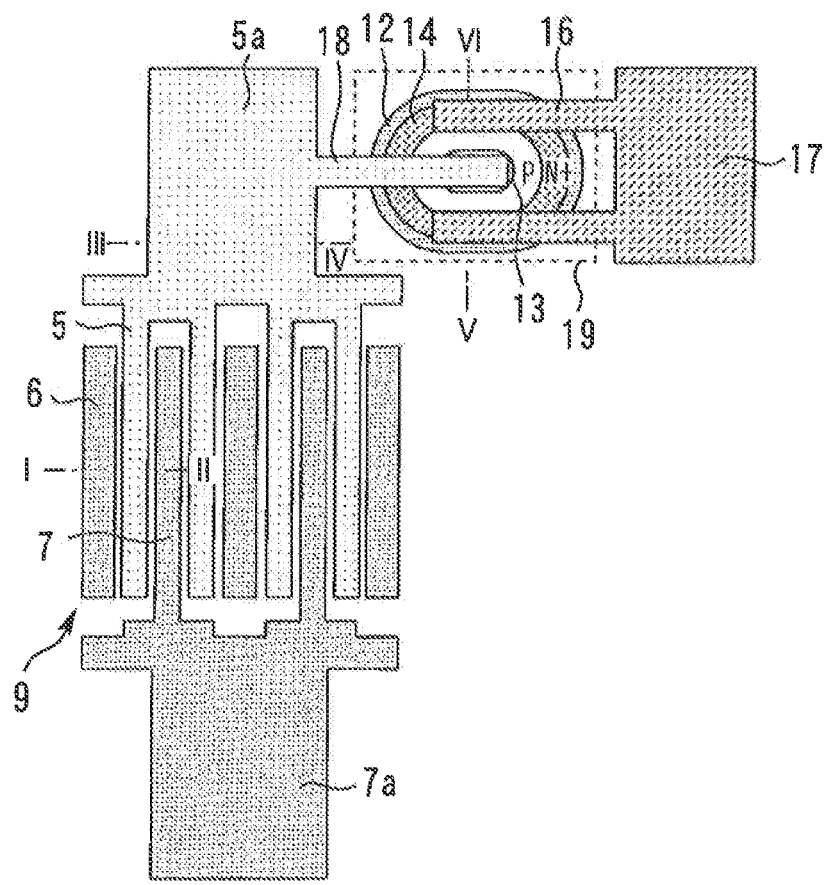
FIG. 1 is a top view of a semiconductor device according to a first embodiment of the present invention.
Figure 2:
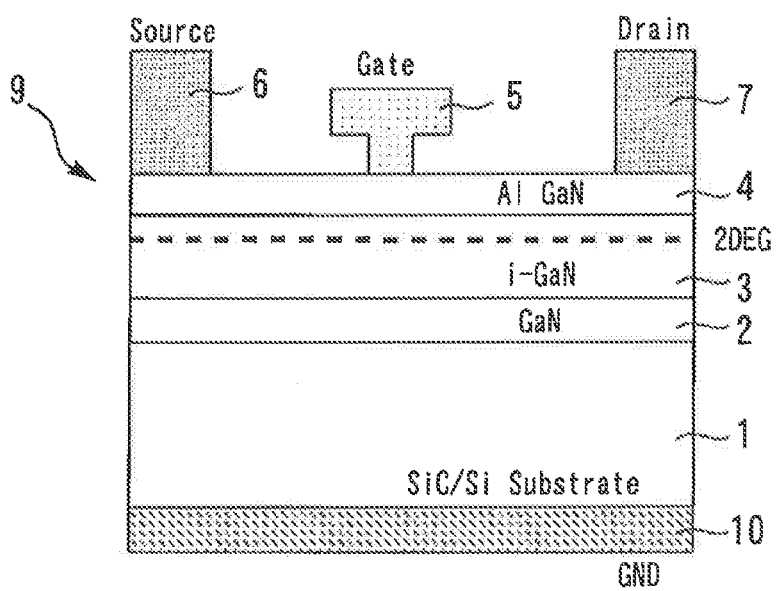
FIG. 2 is a sectional view taken along line I-II in FIG. 1.

FIG. 1 is a top view of a semiconductor device according to a first embodiment of the present invention. FIG. 2 is a sectional view taken along line I-II in FIG. 1. A semiconductor substrate 1 is made of silicon carbide (SiC) or silicon (Si) and provided as a support substrate for a gallium nitride (GaN) epilayer. A GaN buffer layer 2, an undoped GaN channel layer 3 and an AlGaN electron supply layer 4 are successively formed on an upper surface of the semiconductor substrate 1.

The GaN buffer layer 2 moderates the difference between the lattice constants of SiC or Si and GaN. A gate electrode 5, a source electrode 6 and a drain electrode 7 are provided on an upper surface of an AlGaN electron supply layer 4. These electrodes are disposed in comb form as viewed in plan. A gate pad 5a is connected to the gate electrode 5. A drain pad 7a is connected to the drain electrode 7. These elements form a field effect transistor 9. In this embodiment, the field effect transistor 9 is a GaN-HEMT.

A back electrode 10 is formed on a lower surface of the semiconductor substrate 1. The back electrode 10 is made of titanium (Ti), nickel (Ni), gold (Au), or the like and is normally grounded (GND). At the heterojunction between the AlGaN electron supply layer 4 and the undoped GaN channel layer 3, high-concentration, high-mobility two-dimensional electron gas (2DEG) is obtained by spontaneous polarization and piezoelectric polarization. Therefore, the field effect transistor 9 is capable of high-frequency operation at a high voltage and a high current.

Figure 3:
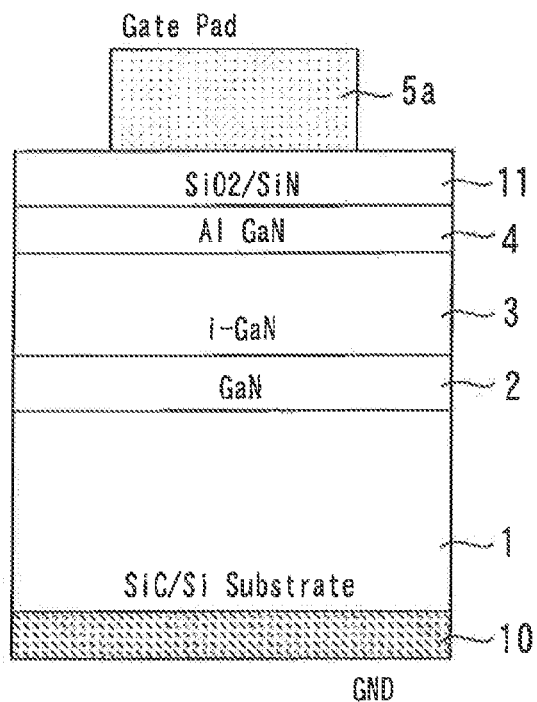
FIG. 3 is a sectional view taken along line III-IV in FIG. 1.

FIG. 3 is a sectional view taken along line III-IV in FIG. 1. The gate pad 5a is formed on the AlGaN electron supply layer 4 with an insulating film 11 interposed therebetween. The insulating film 11 is formed of silicon oxide film ($SiO_2$) or silicon nitride film (SiN).

Figure 4:
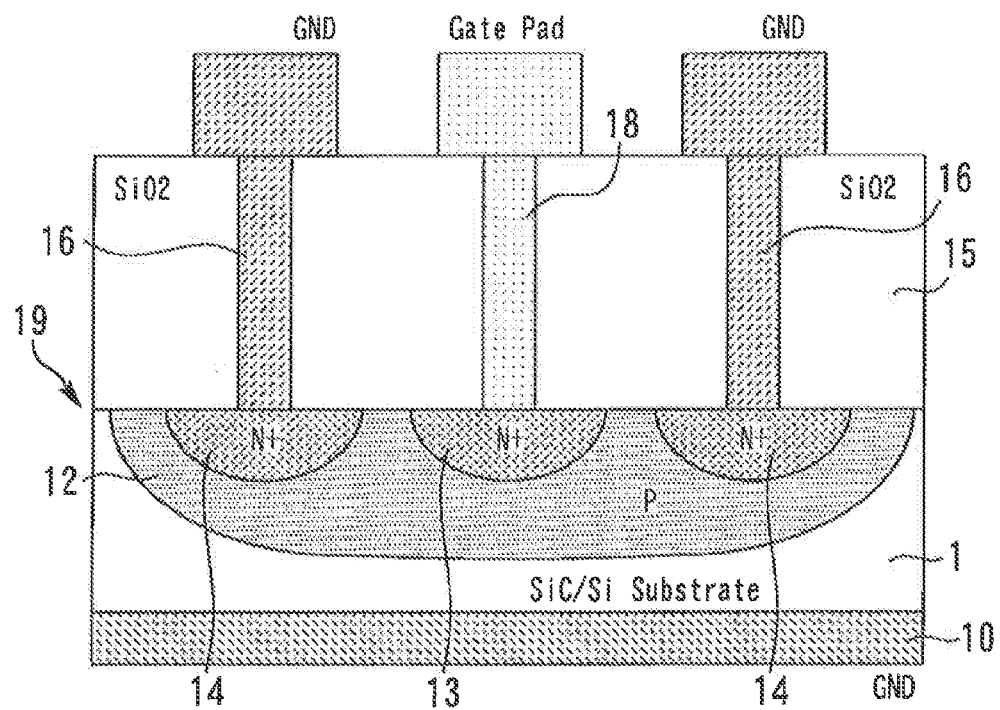
FIG. 4 is a sectional view taken along line V-VI in FIG. 1.

FIG. 4 is a sectional view taken along line V-VI in FIG. 1. A P-type diffusion layer 12 is formed on the upper surface of the semiconductor substrate 1. An $N^+$-type diffusion layer 13 is formed in a central portion of the P-type diffusion layer 12, while an $N^+$-type diffusion layer 14 is formed in a peripheral portion of the P-type diffusion layer 12. An insulating film 15 formed of silicon oxide film ($SiO_2$) is formed on the P-type diffusion layer 12, the $N^+$-type diffusion layer 13 and the $N^+$-type diffusion layer 14. The impurity concentration in the P-type diffusion layer 12 is lower than that in the $N^+$-type diffusion layers 13 and 14.

A connection electrode 16 connects the P-type diffusion layer 12 to a grounding pad 17 through vias provided in the insulating film 15. The grounding pad 17 is connected to a grounding point by a wire or a via. A connection electrode 18 connects the N+-type diffusion layer 13 to the gate pad 5a through a via provided in the insulating film 15.

Figure 5:
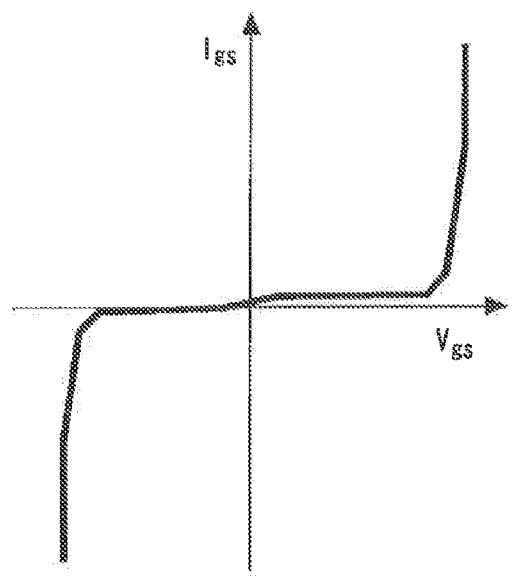
FIG. 5 is a diagram showing an electrical characteristic of the surge protection element according to the first embodiment of the present invention.

The P-type diffusion layer 12, the $N^+$-type diffusion layer 13 and the $N^+$-type diffusion layer 14 constitute a bidirectional lateral diode. This lateral diode is a surge protection element 19 for the gate. FIG. 5 is a diagram showing an electrical characteristic of the surge protection element according to the first embodiment of the present invention. The surge protection element 19 breaks down when a voltage exceeding a set positive or negative voltage is applied between the gate and source.

Figure 6:
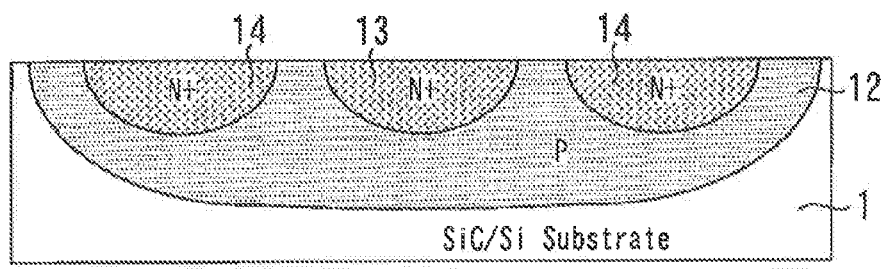
FIGS. 6 to 8 are sectional views showing the process of manufacturing the semiconductor device according to the first embodiment of the present invention.
Figure 7:
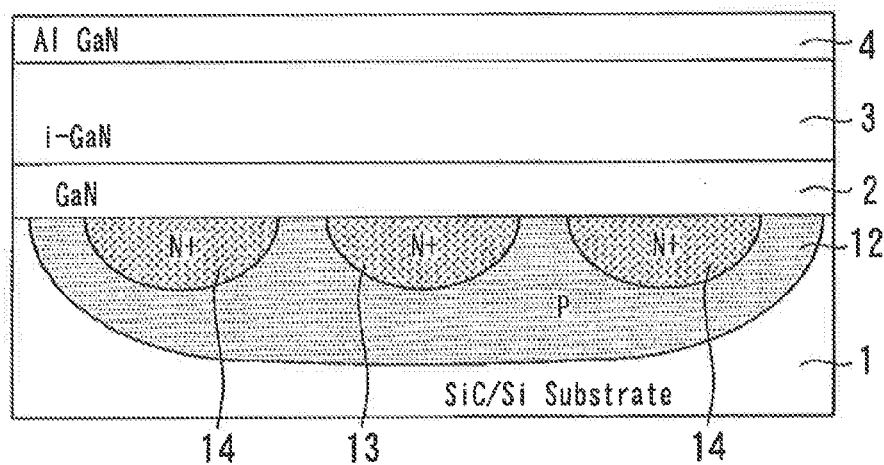
Figure 8:
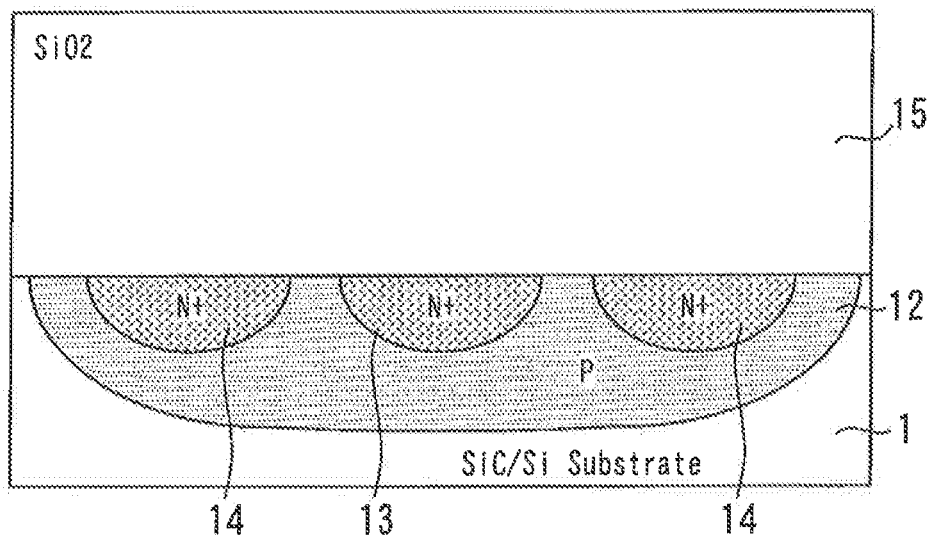

A method of manufacturing the above-described semiconductor device will subsequently be described. FIGS. 6 to 8 are sectional views showing the process of manufacturing the semiconductor device according to the first embodiment of the present invention.

First, as shown in FIG. 6, in the surge protection element region, the semiconductor substrate 1 is doped through its upper surface with a P-type impurity (boron, aluminum, or the like) at a concentration of $10^{15}$ to $10^{17}$ atoms/cm$^3$ by ion implantation or diffusion, followed by annealing and driving by a high-temperature heat treatment at 800 to 1200° C., thereby forming the P-type diffusion layer 12. Next, the P-type diffusion layer 12 is doped with an N-type impurity (arsenic, phosphorus, or the like) at a concentration of $10^{18}$ to $10^{20}$ atoms/cm$^3$ by ion implantation or diffusion, followed by annealing and driving by a high-temperature heat treatment at 800 to 1200° C., thereby forming the $N^+$-type diffusion layers 13 and 14.

Next, as shown in FIG. 7, the GaN buffer layer 2, the undoped GaN channel layer 3 and the AlGaN electron supply layer 4 are successively formed on the entire upper surface of the semiconductor substrate 1 by metal organic chemical vapor deposition (MOCVD) or the like. The gate electrode 5 and other elements are thereafter formed, thereby forming the field effect transistor 9.

Next, as shown in FIG. 8, in the surge protection element region, the GaN buffer layer 2, the undoped GaN channel layer 3 and the AlGaN electron supply layer 4 are removed. Insulating film 15 such as silicon oxide film ($SiO_2$) that covers the exposed semiconductor substrate 1, P-type diffusion layer 12 and $N^+$-type diffusion layers 13 and 14 is thereafter formed by chemical vapor deposition (CVD) or the like.

The operation of the surge protection element 19 will subsequently be described. When a positive potential based on the back electrode 10 is applied to the gate pad 5a, the diode constituted by the P-type diffusion layer 12 and the $N^+$-type diffusion layer 14 on the ground side is in the forward connection and, therefore, a current flows through the P-type diffusion layer 12, while the diode constituted by the $N^+$-type diffusion layer 13 on the gate side and the P-type diffusion layer 12 is in the reverse connection and no current flows at a voltage equal to or higher than the breakdown voltage.

When a voltage equal to or higher than the avalanche breakdown voltage is applied between the $N^+$-type diffusion layer 13 and the P-type diffusion layer 12 by a surge, a breakdown current flows abruptly. Since the diode constituted by the $N^+$-type diffusion layer 14 and the P-type diffusion layer 12 is in the forward connection, the breakdown current flows to the grounding point via the $N^+$-type diffusion layer 14, the connection electrode 16 and the grounding pad 17.

In a GaN-HEMT using a high-voltage power source (Vdd=20 to 100 V), the gate voltage amplitude during high-frequency operation can become several times (two to three times) higher than the power supply voltage. Then, the breakdown voltage of the diode constituted by the $N^+$-type diffusion layer 14 and the P-type diffusion layer 12, the breakdown voltage of the diode constituted by the $N^+$-type diffusion layer 13 and the P-type diffusion layer 12 and the difference between the breakdown voltages of the two diodes are set to a range of voltage wider than the range of voltage of the gate voltage amplitude at the time of high-frequency operation, such that each diode does not break down during high-frequency operation. Further, these voltages are set lower than the drain-gate breakdown voltage and the gate-source breakdown voltage, thereby enabling the diode to break down earlier than the field effect transistor 9 when a surge flows into the gate.

The surge protection element 19 in the present embodiment functions as a bidirectional diode connected between the gate of the field effect transistor 9 and the grounding point. Therefore, the active region of the field effect transistor 9 can be prevented from being broken or degraded by discharge or heat generation even when a surge current flows from the outside into the gate.

Also, the breakdown voltage of the diode can be controlled by adjusting the depth of the $N^+$-type diffusion layers 13 and 14, the impurity concentration in the P-type diffusion layer 12 and the spacing between the $N^+$-type diffusion layers 13 and 14. More specifically, the breakdown voltage is increased if the depth of the $N^+$-type diffusion layers 13 and 14 is increased; the P-type impurity concentration in the P-type diffusion layer 12 is reduced; and the spacing between the $N^+$-type diffusion layers 13 and 14 is increased.

Also, by connecting the P-type diffusion layer 12 to the grounding point by means of the connection electrode 16, the distance from the gate electrode 5 to the grounding point is reduced and the series resistance of the diode after breakdown is reduced. Thus, the diode can be prevented from being thermally broken by a surge current.

In the bidirectional lateral diode in the present embodiment, the same effect can also be obtained in a case where the P-type diffusion layer 12 is replaced with an N-type diffusion layer and the $N^+$-type diffusion layers 13 and 14 are replaced with $P^+$-type diffusion layers.

Second Embodiment

Figure 9:
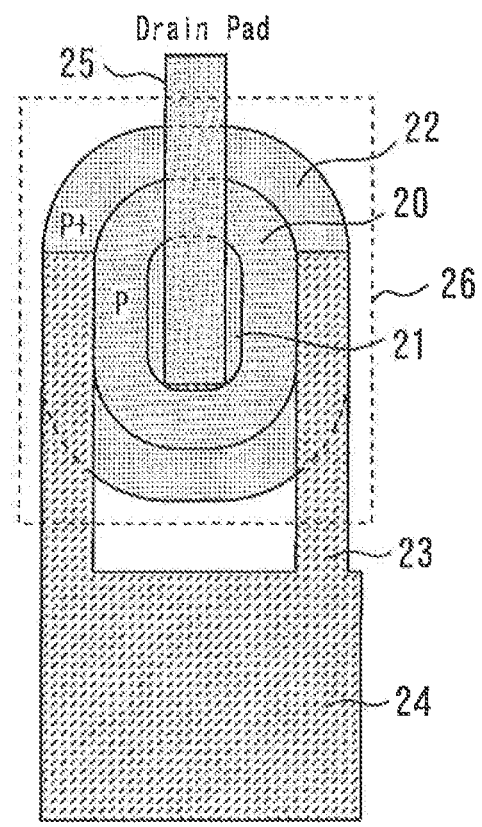
FIG. 9 is a top view of a surge protection element according to a second embodiment the present invention.
Figure 10:
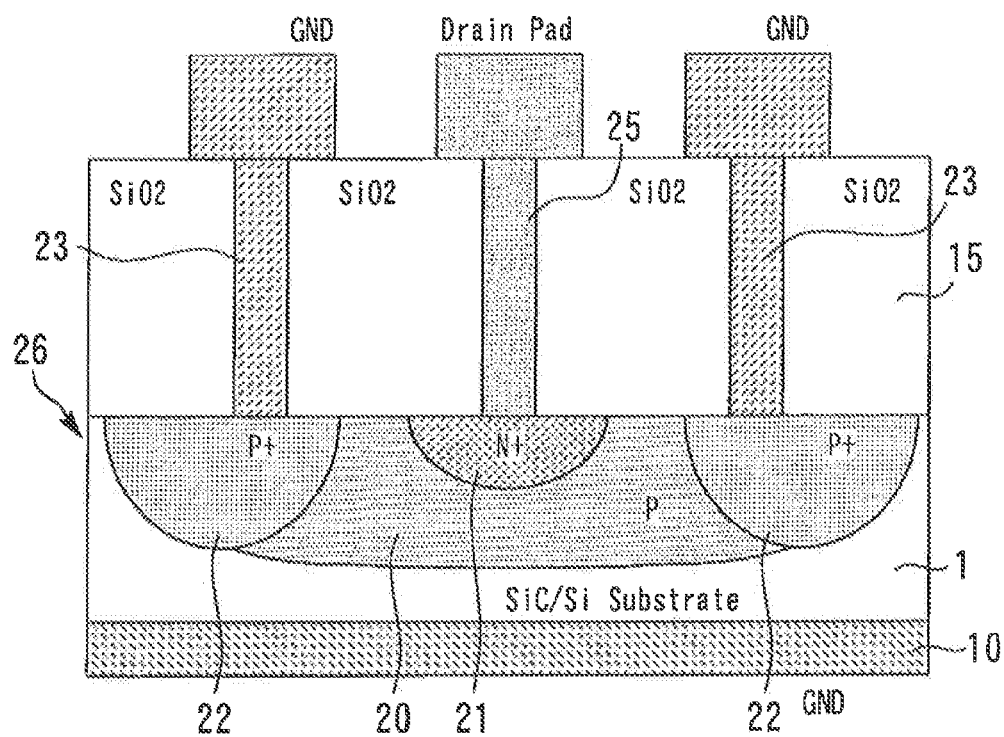
FIG. 10 is a sectional view of the surge protection element according to the second embodiment of the present invention.

FIG. 9 is a top view of a surge protection element according to a second embodiment the present invention. FIG. 10 is a sectional view of the surge protection element according to the second embodiment of the present invention. A P-type diffusion layer 20 is formed on the upper surface of the semiconductor substrate 1. An N+-type diffusion layer 21 is formed in a central portion of the P-type diffusion layer 20, while a P+-type diffusion layer 22 is formed in a peripheral portion of the P-type diffusion layer 20. The impurity concentration in the P-type diffusion layer 20 is lower than that in the N+-type diffusion layer 21. An insulating film 15 formed of silicon oxide film ($SiO_2$) is formed on the P-type diffusion layer 20, the N+-type diffusion layer 21 and the P+-type diffusion layer 22.

Figure 11:
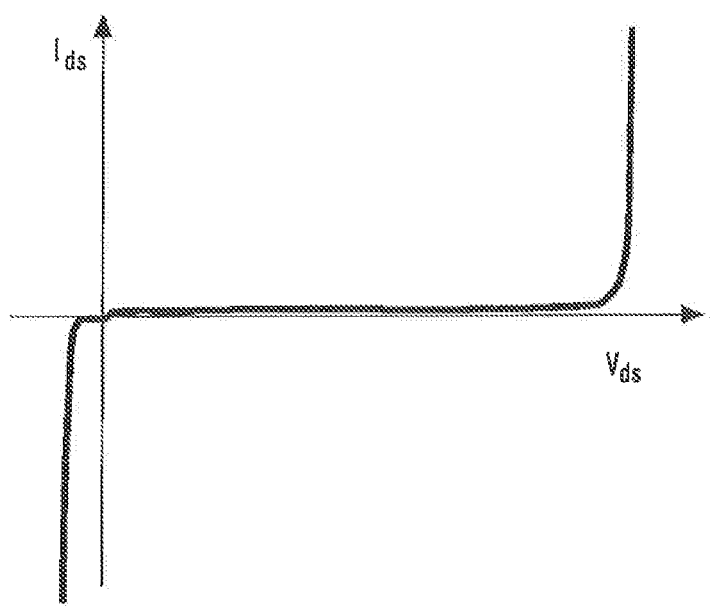
FIG. 11 is a diagram showing an electrical characteristic of the surge protection element according to the second embodiment of the present invention.

A connection electrode 23 connects the P+-type diffusion layer 22 to a grounding pad 24 through vias provided in the insulating film 15. The grounding pad 24 is connected to a grounding point by a wire or a via. A connection electrode 25 connects the N+-type diffusion layer 21 to the drain pad 7a through a via provided in the insulating film 15. The P-type diffusion layer 20, the N+-type diffusion layer 21 and the P+-type diffusion layer 22 constitute a bidirectional lateral diode. This lateral diode is a surge protection element 26 for the drain. FIG. 11 is a diagram showing an electrical characteristic of the surge protection element according to the second embodiment of the present invention. The surge protection element 26 breaks down when a voltage exceeding a set positive or negative voltage is applied between the source and the drain.

A method of manufacturing the above-described semiconductor device will subsequently be described. The P-type diffusion layer 20 and the N+-type diffusion layer 21 are formed by the same method as that for the P-type diffusion layer 12 and the N+-type diffusion layers 13 and 14 in the first embodiment. The P+-type diffusion layer 22 is formed by doping the P-type diffusion layer 20 with a P-type impurity (boron, aluminum, or the like) at a concentration of $10^{18}$ to $10^{20}$ atoms/cm$^3$ by ion implantation or diffusion and by performing annealing and driving by a high-temperature heat treatment at 800 to 1200° C. The P-type diffusion layer 20, the N+-type diffusion layer 21 and the P+-type diffusion layer 22 are formed before forming of the GaN epitaxial layer constituting the field effect transistor 9, as in the first embodiment. The manufacturing process steps thereafter performed are also the same as those in the first embodiment.

The operation of the surge protection element 26 will subsequently be described. When a positive potential based on the back electrode 10 is applied to the drain pad 7a, the diode constituted by the N+-type diffusion layer 21 and the P-type diffusion layer 20 is in the reverse connection and, therefore, no current flows at a voltage equal to or lower than the avalanche breakdown voltage.

When a voltage equal to or higher than the avalanche breakdown voltage is applied between the N+-type diffusion layer 21 and the P-type diffusion layer 20 by a surge, a breakdown current flows abruptly. The breakdown current flows to the grounding point via the P+-type diffusion layer 22, the connection electrode 23 and the grounding pad 24.

The breakdown voltage of the diode is set to a range of voltage wider than the range of voltage of the drain voltage amplitude at the time of high-frequency operation, such that the diode does not break down during high-frequency operation. Further, this voltage is set lower than the drain-gate breakdown voltage and the gate-source breakdown voltage, thereby enabling the diode to break down earlier than the field effect transistor 9 when a surge flows into the drain.

The surge protection element 26 in the present embodiment functions as a lateral diode connected between the drain of the field effect transistor 9 and the grounding point. Therefore, the active region of the field effect transistor 9 can be prevented from being broken or degraded by discharge or heat generation even when a surge current flows from the outside into the drain.

Also, the breakdown voltage of the diode can be controlled by adjusting the depth of the N+-type diffusion layer 21, the impurity concentration in the P-type diffusion layer 20 and the spacing between the N+-type diffusion layer 21 and the P+-type diffusion layer 22. More specifically, the breakdown voltage is increased if the depth of the N+-type diffusion layer 21 is increased; the impurity concentration in the P-type diffusion layer 20 is reduced; and the spacing between the N+-type diffusion layer 21 and the P+-type diffusion layer 22 is increased.

Also, as a result of connecting the P-type diffusion layer 20 to the grounding point by the connection electrode 23, the distance from the drain electrode 7 to the grounding point is reduced and the series resistance of the diode after breakdown is reduced. Thus, the diode can be prevented from being thermally broken by a surge current.

Third Embodiment

Figure 12:
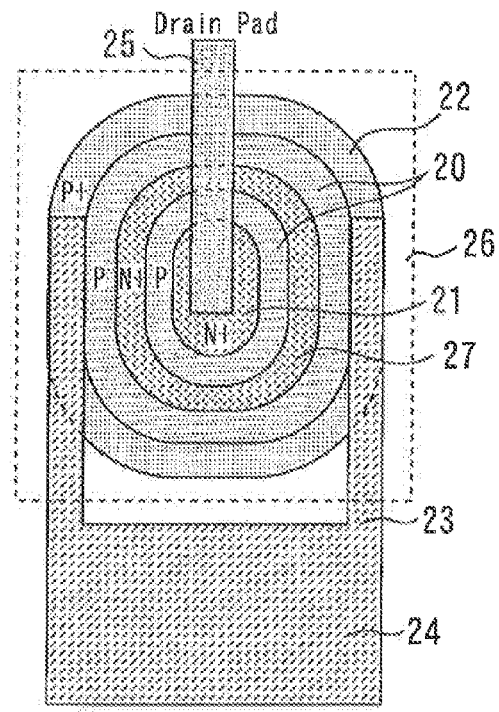
FIG. 12 is a top view of a surge protection element according to a third embodiment of the present invention.
Figure 13:
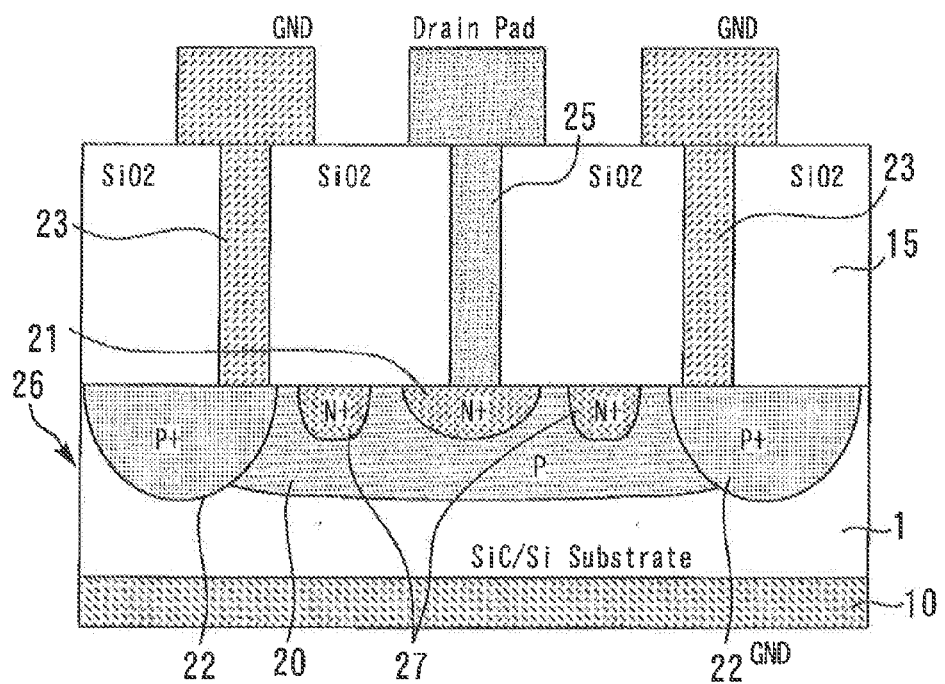
FIG. 13 is a sectional view of the surge protection element according to the third embodiment of the present invention.

FIG. 12 is a top view of a surge protection element according to a third embodiment of the present invention. FIG. 13 is a sectional view of the surge protection element according to the third embodiment of the present invention. An N+-type guard ring diffusion layer 27 is formed between the N+-type diffusion layer 21 and the P+-type diffusion layer 22 in the P-type diffusion layer 20. In other respects, the construction is the same as that in the second embodiment.

The N+-type guard ring diffusion layer 27 is formed by doping with an N-type impurity (arsenic, phosphorus, or the like) at a concentration of $10^{18}$ to $10^{20}$ atoms/cm$^3$ by ion implantation or diffusion and by performing a high-temperature heat treatment at 800 to 1200° C., as is the N+-type diffusion layer 21. The N+-type guard ring diffusion layer 27 may be formed by the same process steps as those for the N+-type diffusion layer 21 or by different process steps.

When a voltage is applied between the diodes in the surge protection element 26, a depletion layer is generated in the N+-type diffusion layer 21 and the P-type diffusion layer 20. At this time, the electric field intensity in a junction portion or an end portion of smaller radius of curvature in these two layers is increased, so that avalanche breakdown can occur easily. In the present embodiment, therefore, the N+-type guard ring diffusion layer 27 is provided along the outer periphery of the N+-type diffusion layer 21 to promote lateral spreading of the depletion layer generated in the N+-type diffusion layer 21 and the P-type diffusion layer 20 at the time of voltage application so that the radius of curvature of the depletion layer is increased. Thus, the avalanche breakdown voltage can be increased by moderating the electric field in the junction potion or the end portion having a smaller radius of curvature in the N+-type diffusion layer 21 and the P-type diffusion layer 20. That is, a unidirectional diode having a high breakdown voltage can be constructed since the electric field at the time of application of a reverse voltage can be moderated.

Not only adjustment of the depth of the N+-type diffusion layer 21 but also adjustment of the depth of the N+-type guard ring diffusion layer 27 and the spacing between the N+-type diffusion layer 21 and the N+-type guard ring diffusion layer 27 may be performed to control the breakdown voltage of the diode. A plurality of N+-type guard ring diffusion layers 27 may be used.

Fourth Embodiment

Figure 14:
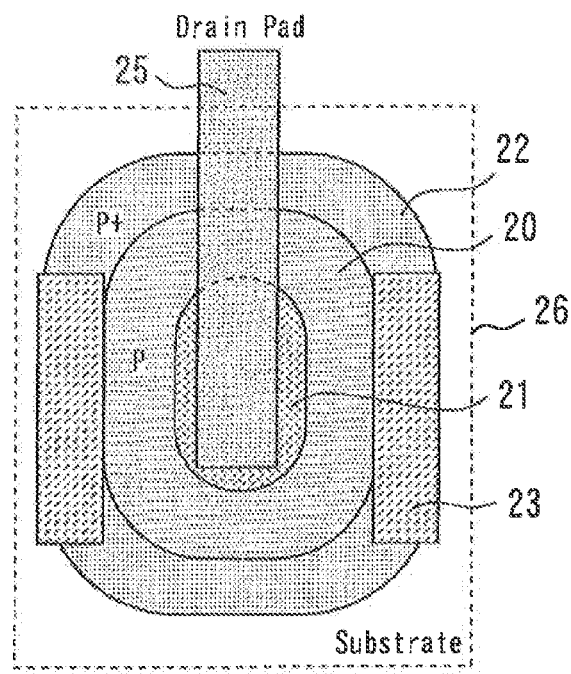
FIG. 14 is a top view of a surge protection element according to a fourth embodiment of the present invention.
Figure 15:
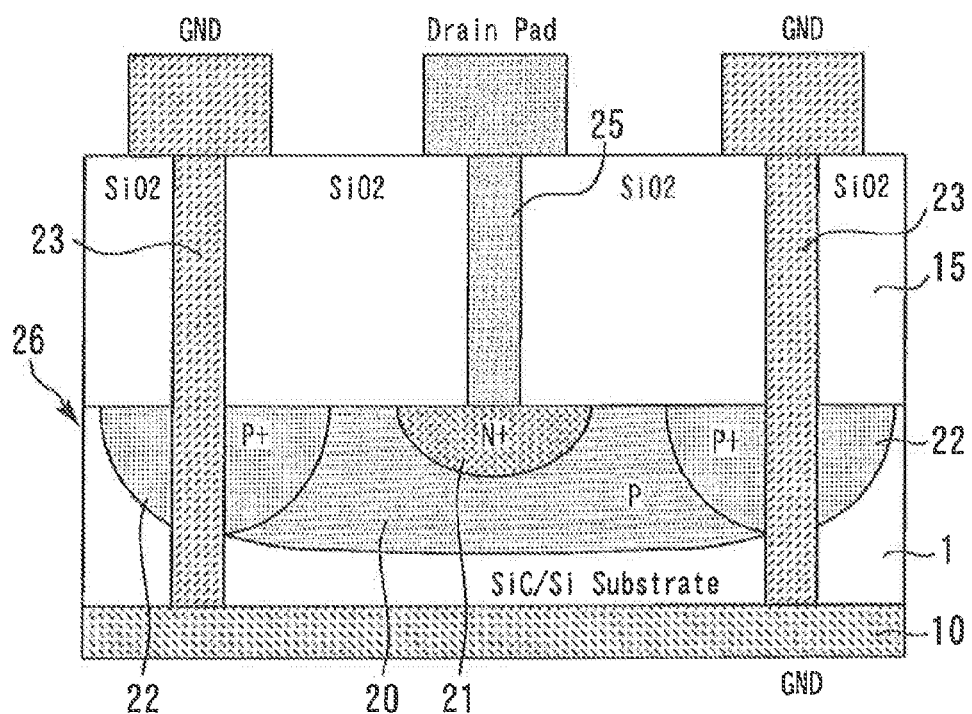
FIG. 15 is a sectional view of the surge protection element according to the fourth embodiment of the present invention.

FIG. 14 is a top view of a surge protection element according to a fourth embodiment of the present invention. FIG. 15 is a sectional view of the surge protection element according to the fourth embodiment of the present invention. The connection electrode 23 passes not only the insulating film 15 that covers the surge protection element 26 but also the semiconductor substrate 1. The connection electrode 23 passes through the semiconductor substrate 1 to be grounded by being connected to the back electrode 10. Since the need for the grounding pad 24 is eliminated in this way, the chip area can be reduced. The operation of the surge protection element 26 and other effects are the same as those in the second and other embodiments.

Fifth Embodiment

Figure 16:
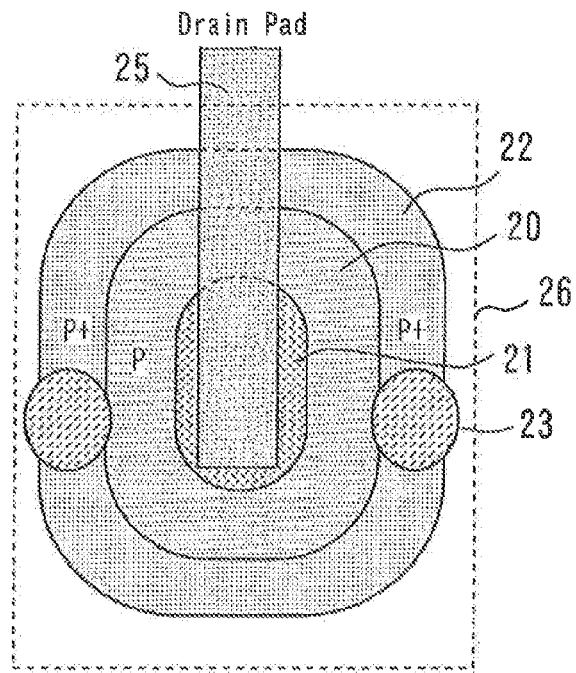
FIG. 16 is a top view of a surge protection element according to a fifth embodiment of the present invention.
Figure 17:
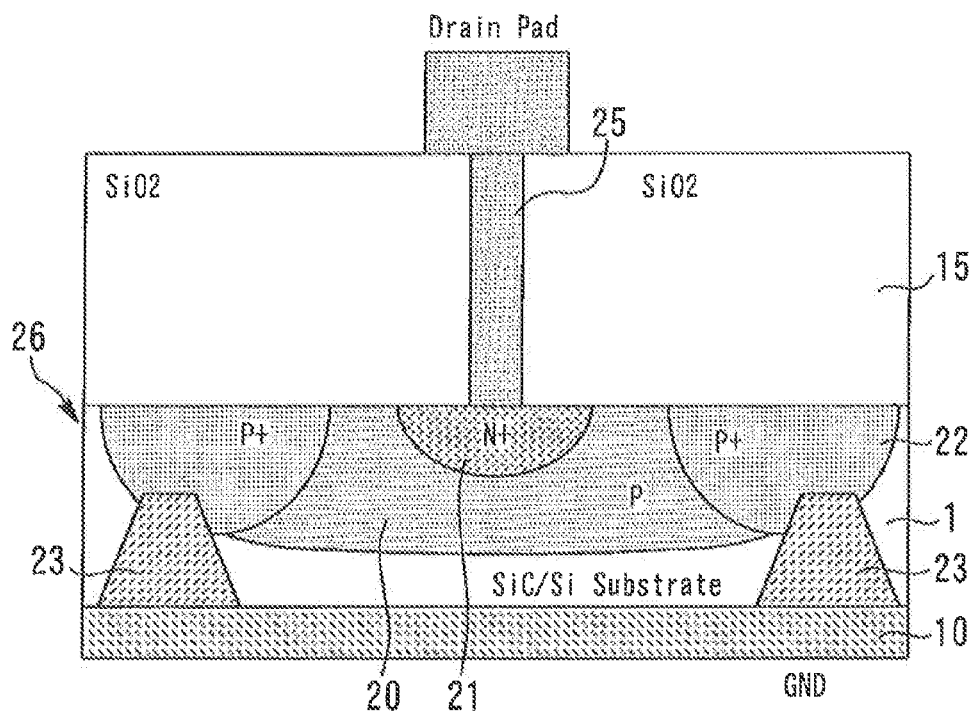
FIG. 17 is a sectional view of the surge protection element according to the fifth embodiment of the present invention.

FIG. 16 is a top view of a surge protection element according to a fifth embodiment of the present invention. FIG. 17 is a sectional view of the surge protection element according to the fifth embodiment of the present invention. The connection electrode 23 does not pass through the insulating film 15 that covers the surge protection element 26. The connection electrode 23 is formed by filling a via hole etched from the lower surface of the semiconductor substrate 1 to a bottom portion of the P$^+$-type diffusion layer 22 with a metallic material or the like. The connection electrode 23 passes through the semiconductor substrate 1 to be grounded by being connected to the back electrode 10. Since not only the need for the grounding pad 24 but also the need for the GND wiring in the insulating film 15 is eliminated in this way, the chip area can be reduced relative to that in the fourth embodiment. The operation of the surge protection element 26 and other effects are the same as those in the second and other embodiments.

Sixth Embodiment

Figure 18:
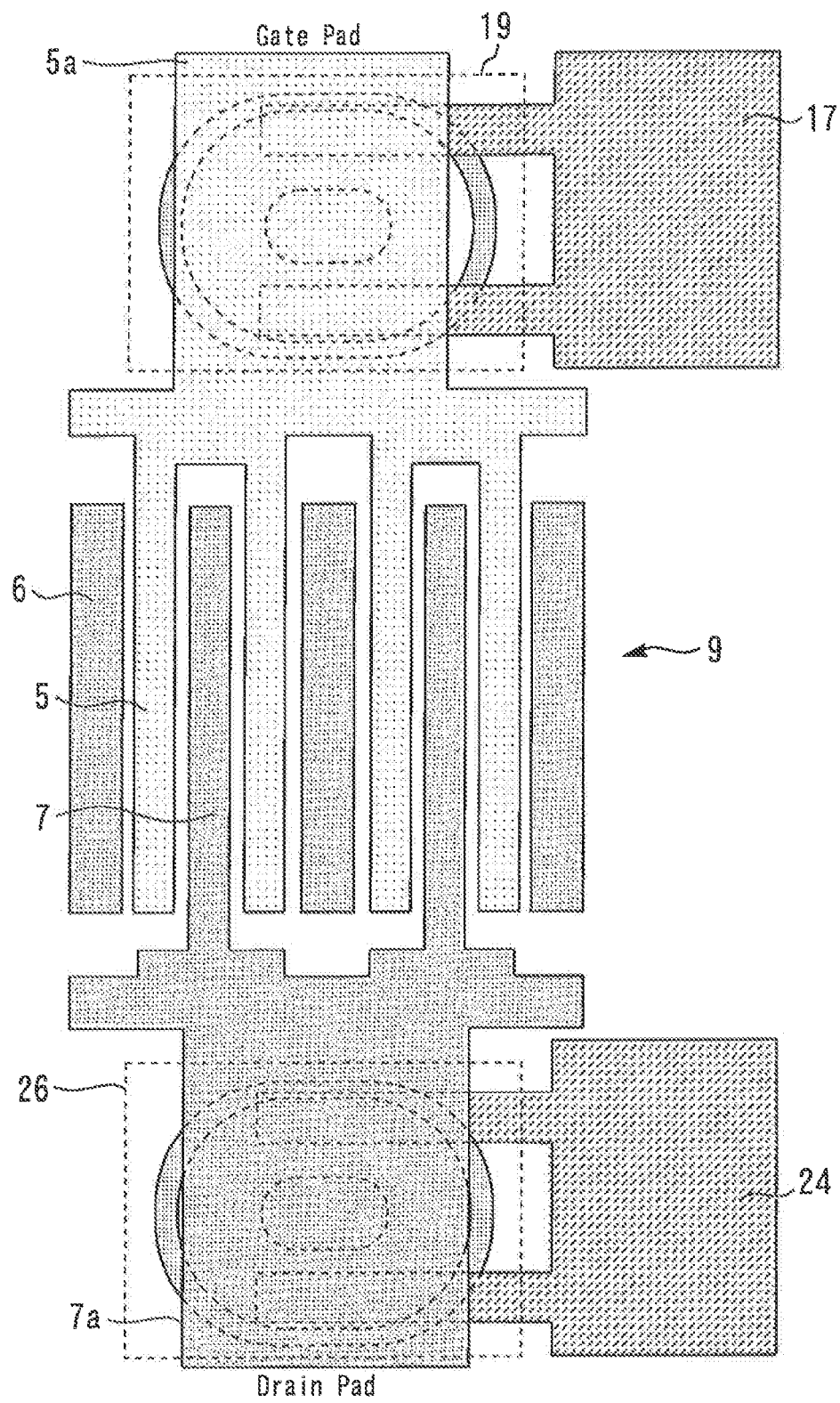
FIG. 18 is a top view of a semiconductor device according to a sixth embodiment of the present invention.
Figure 19:
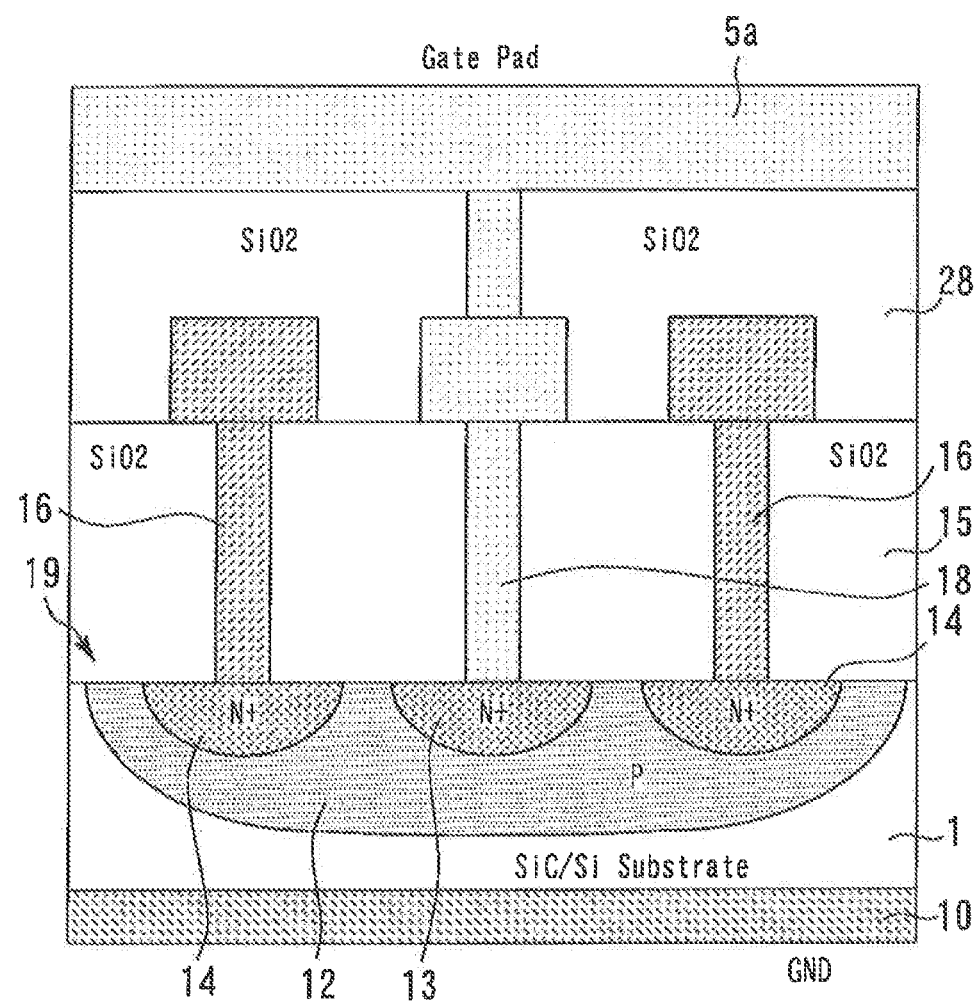
FIG. 19 is a sectional view of the surge protection element according to the sixth embodiment of the present invention.

FIG. 18 is a top view of a semiconductor device according to a sixth embodiment of the present invention. FIG. 19 is a sectional view of the surge protection element according to the sixth embodiment of the present invention. The surge protection element 19 for the gate is disposed right below the gate pad 5a with insulating film 28 interposed therebetween, while the surge protection element 26 for the drain is disposed right below the drain pad 7a with insulating film 28 interposed therebetween. The connection electrode 18 for the surge protection element 19 is connected to the gate pad 5a, while the connection electrode 25 (see FIG. 10) for the surge protection element 26 is connected to the drain pad 7a.

The surge protection elements 19 and 26 are disposed right below the gate pad 5a and the drain pad 7a having no influence on the active region of the field effect transistor 9, thus obtaining the surge protection effect without increasing the chip area. The structure according to the first embodiment is used as the surge protection element 19 for the gate, and the structure according to the second embodiment is used as the surge protection element 26 for the drain. However, the structures according to the other embodiments may alternatively be used as the surge protection elements 19 and 26.

Seventh Embodiment

Figure 20:
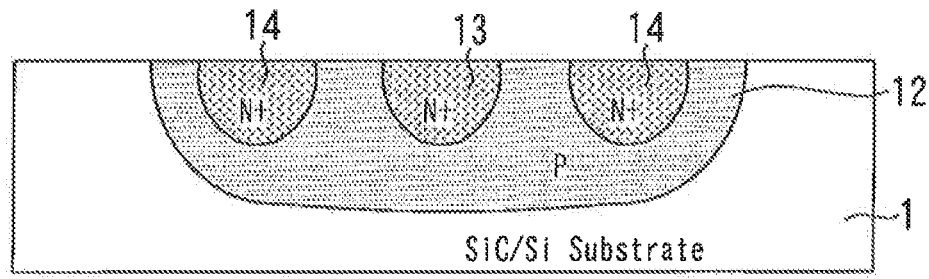
FIGS. 20 to 24 are sectional views showing the process of manufacturing a semiconductor device according to a seventh embodiment of the present invention.

FIGS. 20 to 24 are sectional views showing the process of manufacturing a semiconductor device according to a seventh embodiment of the present invention. First, as shown in FIG. 20, the P-type diffusion layer 12, the N$^+$-type diffusion layer 13 and the N$^+$-type diffusion layer 14 constituting a lateral diode are formed on the upper surface of the semiconductor substrate 1, as in the case of the first embodiment.

Figure 21:
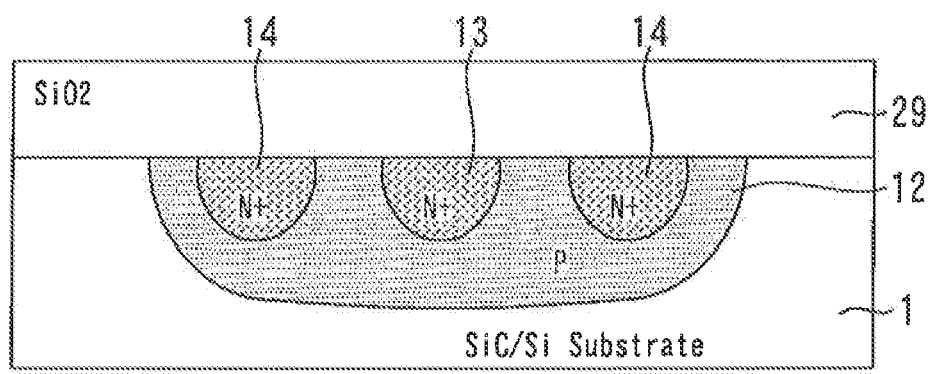

Next, as shown in FIG. 21, insulating film 29 such as silicon oxide film is formed on the entire upper surface of the semiconductor substrate 1. For this forming, CVD is used if the semiconductor substrate 1 is SiC, or thermal oxidation or CVD is used if the semiconductor substrate 1 is Si.

Figure 22:
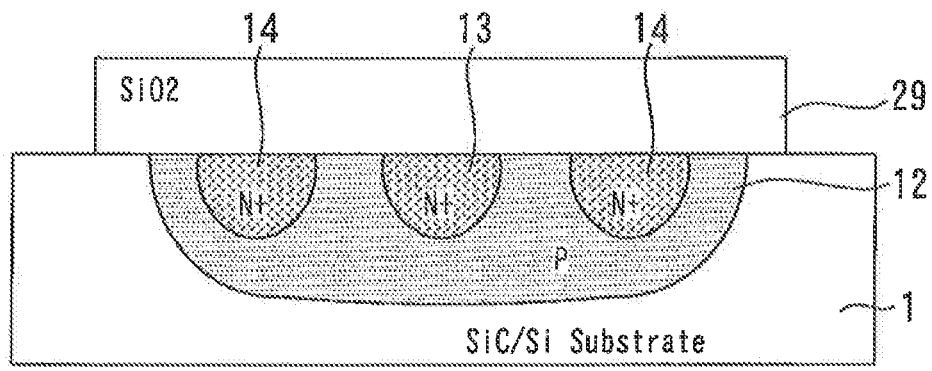

Next, as shown in FIG. 22, the insulating film 29 is removed from the transistor region and other regions, while the insulating film 29 on the surge protection element and on the periphery of the same is left. The insulating film 29 that covers the P-type diffusion layer 12 and the N$^+$-type diffusion layers 13 and 14 is thereby left as a part on the semiconductor substrate 1.

Figure 23:
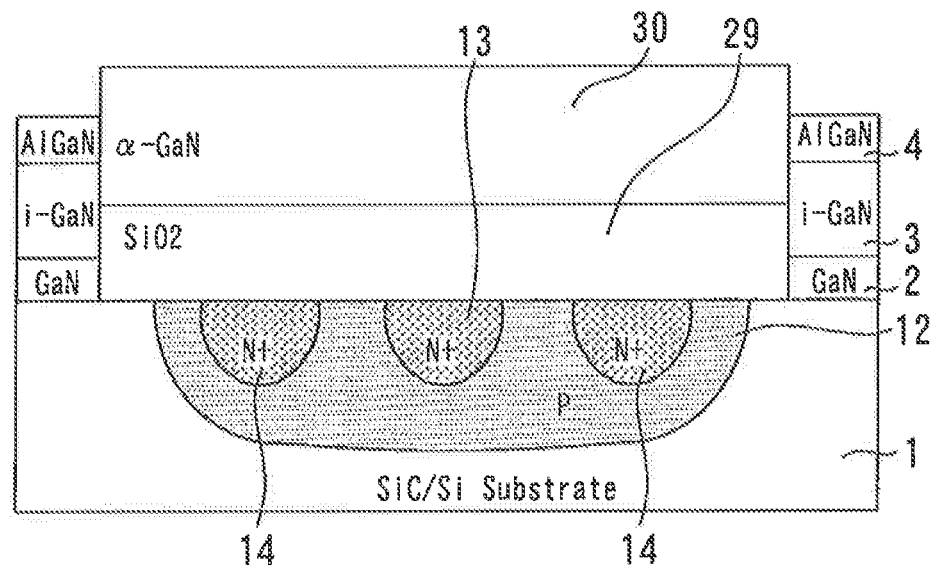

Next, the GaN buffer layer 2, the undoped GaN channel layer 3 and the AlGaN electron supply layer 4 are successively formed on the semiconductor substrate 1 not covered with the insulating film 29, and the gate electrode 5, the drain electrode 7 and the source electrode 6 are formed thereon, thereby forming the field effect transistor 9. At this time, as shown in FIG. 23, an amorphous semiconductor layer 30, which is amorphous GaN, is formed on the insulating film 29.

Figure 24:
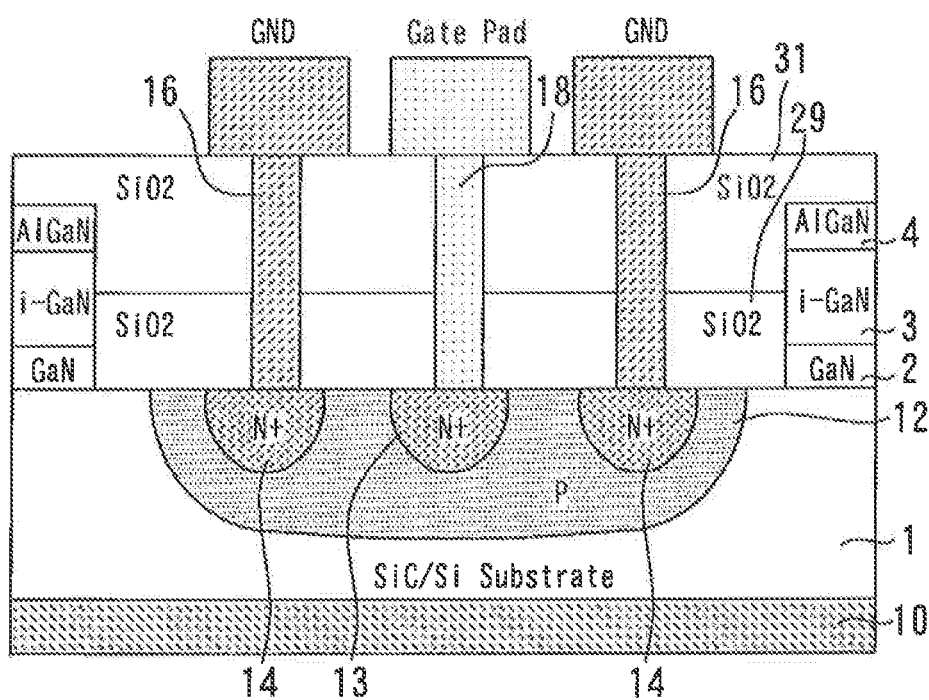

Next, as shown in FIG. 24, the amorphous semiconductor layer 30 is removed and insulating film 31 of SiO$_2$ or the like is formed by chemical vapor deposition or the like. Contact holes are opened in the insulating films 29 and 31, and the connection electrodes 16 and 18 are formed. In other respects, the construction and the manufacturing process are the same as those in the first embodiment.

In the present embodiment, the interface state and the crystal defect density in the surface of the surge protection element 19 can be reduced by covering the surge protection element 19 with the insulating film 29. The initial leak current through the diode in the surge protection element 19 is thereby reduced to achieve a state where hot carriers (electrons or holes) generated when avalanche breakdown of one of the diodes is caused are not easily trapped by the boundaries between the insulating film 29 and the semiconductor substrate 1, the P-type diffusion layer 12 and the N+-type diffusion layers 13 and 14. As a result, even in a case where the field effect transistor 9 operates for a long time to undergo surge inflow many times, degradations such as increases in leak current and reductions in withstand voltage of the diodes in the surge protection element 19 can be prevented.

Since the GaN buffer layer 2, the undoped GaN channel layer 3 and the AlGaN electron supply layer 4 are formed while the insulating film 29 is left in the surge protection element region, the amorphous semiconductor layer 30, which is amorphous GaN, is formed on the insulating film 29. Because many irregular bonds exist in the amorphous semiconductor layer 30, metal elements (e.g., iron, copper, chromium and nickel) mixing in at the time of formation of the epitaxial layer and the electrodes, lattice constant mismatches and crystal defects caused from stresses due to the mismatches can be captured in the amorphous semiconductor layer 30. Pits and dislocation loops in the transistor region can therefore be reduced. As a result, the leak current and variations in characteristics during long-time operation of the field effect transistor 9 can be reduced.

Also in the case of using the manufacturing method according to the seventh embodiment to manufacture the semiconductor devices according to the second to sixth embodiments, the same effects can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-118017, filed on Jun. 4, 2013 including specification, claims, drawings and summary, on which the Convention priority of the present application is based, is incorporated herein by reference in its entirety.

What is claimed is:

1. A semiconductor device comprising:
   a semiconductor substrate having an upper surface and a lower surface;
   a field effect transistor having a semiconductor layer on the upper surface of the semiconductor substrate, a gate electrode, a drain electrode, and a source electrode;
   a P-type diffusion region in the semiconductor substrate and extending to the upper surface of the semiconductor substrate;
   a first N-type diffusion region in the semiconductor substrate and extending to the upper surface of the semiconductor substrate;
   a first connection electrode connecting the P-type diffusion region to a grounding point; and
   a second connection electrode connecting the first N-type diffusion region to the gate electrode or the drain electrode, wherein the P-type diffusion region and the first N-type diffusion region constitute a bidirectional lateral diode.

2. The semiconductor device according to claim 1, wherein the first N-type diffusion region is located within the P-type diffusion region.

3. The semiconductor device according to claim 2, further comprising a second N-type diffusion region in the P-type diffusion region, wherein the first connection electrode is connected to the P-type diffusion region through the second N-type diffusion region.

4. The semiconductor device according to claim 2, wherein
   the first N-type diffusion region is located in a central portion of the P-type diffusion region,
   the first connection electrode is located in a peripheral portion of the P-type diffusion region, and
   the semiconductor device further comprises a second N-type diffusion region located between the peripheral portion and the first N-type diffusion region in the P-type diffusion region.

5. The semiconductor device according to claim 1, further comprising a grounded electrode on the lower surface of the semiconductor substrate, wherein the first connection electrode passes through the semiconductor substrate and is connected to the grounded electrode.

6. The semiconductor device according to claim 1, further comprising a wire-bonding pad connected to the gate electrode or the drain electrode, wherein the P-type diffusion region and the first N-type diffusion region are disposed directly opposite the wire-bonding pad with an insulating film interposed between (i) the P-type diffusion region and the first N-type diffusion region, and (ii) the wire-bonding pad.

* * * * *